United States Patent
Posseme et al.

(10) Patent No.: US 12,261,211 B2
(45) Date of Patent: Mar. 25, 2025

(54) METHOD OF FORMING THE SPACERS OF A TRANSISTOR GATE

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Valentin Bacquie, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 394 days.

(21) Appl. No.: 17/730,459

(22) Filed: Apr. 27, 2022

(65) Prior Publication Data

US 2022/0352344 A1 Nov. 3, 2022

(30) Foreign Application Priority Data

Apr. 28, 2021 (FR) .................................. 21 04449

(51) Int. Cl.
*H01L 29/66* (2006.01)
*H01L 21/02* (2006.01)
(Continued)

(52) U.S. Cl.
CPC .... *H01L 29/6653* (2013.01); *H01L 21/02126* (2013.01); *H01L 21/31111* (2013.01); *H01L 21/3115* (2013.01); *H01L 21/31155* (2013.01)

(58) Field of Classification Search
CPC .......... H01L 29/6653; H01L 29/66772; H01L 21/02126; H01L 21/31111; H01L 21/31155; H01L 21/321; H01L 21/3115
See application file for complete search history.

(56) References Cited

U.S. PATENT DOCUMENTS 6,037,278 A * 3/2000 Koyanagi ......... H01L 21/76828
                                                            438/789
2014/0187046 A1    7/2014 Posseme et al.
(Continued)

FOREIGN PATENT DOCUMENTS

| EP | 3 107 124 B1 | 4/2018 |
| EP | 3 107 125 B1 | 1/2020 |
| JP | 2003-282885 A | 10/2003 |

OTHER PUBLICATIONS

Posseme. Thin layer etching of low-k SiCO spacer using hydrogen ion implantation followed by hydrofluoric acid. J. Vac. Sci. Technol. B 36, 052201. (Year: 2018).*

(Continued)

*Primary Examiner* — Zandra V Smith
*Assistant Examiner* — Douglas Yap
(74) *Attorney, Agent, or Firm* — Oblon, McClelland, Maier & Neustadt, L.L.P.

(57) ABSTRACT

A method for forming spacers of a gate of a transistor is provided, including: providing an active layer surmounted by a gate; forming a dielectric layer covering the gate and the active layer, the dielectric layer having lateral portions, and basal portions covering the active layer; anisotropically modifying the basal portions by implantation of hydrogen-based ions in a direction parallel to the lateral sides of the gate, forming modified basal portions; annealing desorbing the hydrogen from the active layer and transforming the modified basal portions into second modified basal portions; and removing the modified basal portions by selective etching of the modified dielectric material with respect to the non-modified dielectric material and with respect to the semiconductive material, so as to form the spacers on the lateral sides of the gate.

17 Claims, 4 Drawing Sheets

(51) Int. Cl.
    *H01L 21/311*     (2006.01)
    *H01L 21/3115*     (2006.01)

(56) References Cited

U.S. PATENT DOCUMENTS

| | | | |
|---|---|---|---|
| 2016/0300709 A1* | 10/2016 | Posseme | H01L 21/3065 |
| 2016/0372568 A1* | 12/2016 | Posseme | H01L 21/0234 |
| 2017/0084720 A1* | 3/2017 | Pollet | H01L 29/66553 |
| 2017/0338157 A1 | 11/2017 | Posseme et al. | |
| 2019/0164776 A1 | 5/2019 | Choi et al. | |
| 2020/0135467 A1 | 4/2020 | Ma et al. | |
| 2020/0251569 A1 | 8/2020 | Posseme | |
| 2021/0366715 A1 | 11/2021 | Ma et al. | |
| 2022/0013539 A1* | 1/2022 | Isogai | H01L 21/2253 |

OTHER PUBLICATIONS

Tebani. A Global model for the inductively coupled rf discharges in Ar/Hs mixture. Przeglad Elektrotechniczny, ISSN 0033-2097, R. 97 NR Jan. 2021. (Date: Jan. 6, 2021) (Year: 2021).*

Qin. Plasma Ion Implantation Hydrogenation of Poly-Si CMOS Thin-Film Transistors at Low Energy and High Dose Rate Using an Inductively-Coupled Plasma Source. IEEE Transactions on Electron Devices, vol. 45, No. 6. (Year: 1998).*

Extended European search Report issued Sep. 8, 2022 in European Patent Application No. 22170109.7 (with English translation of Category of Cited Documents), 10 pages.

Preliminary French Search Report issued Dec. 27, 2021 in French Application 21 04449 filed on Apr. 28, 2021, 11 pages (with English Translation of Categories of Cited Documents & Written Opinion).

\* cited by examiner

METHOD OF FORMING THE SPACERS OF A TRANSISTOR GATE

TECHNICAL FIELD

The present invention generally relates to field-effect transistors (FET) used by the microelectronics industry and more specifically, for producing gate spacers of metal oxide semiconductor-type transistors (MOSFET) mainly used for producing all types of integrated circuits.

STATE OF THE ART

Complementary Metal Oxide Semiconductor (CMOS) transistor-based technology, based on the use of complementary n type and p type MOSFET transistors, commonly uses SOI (silicon on insulator)-type substrates to increase the performances of transistors.

An SOI substrate, which comprises a so-called topSi, thin superficial monocrystalline silicon layer, resting on a so-called BOX (buried oxide layer) buried silicon oxide layer, in particular enables to drastically reduce the interfering capacities of transistors. This layer is also qualified as an active layer.

To further improve the performances of transistors, it is advantageous that the channel of the transistor in the topSi can be fully depleted (FD) of carriers. To achieve this, it is generally necessary that the topSi is very thin, typically of thickness less than 10 nm. This type of substrate is thus called FDSOI.

Such a thickness makes certain steps of manufacturing transistors critical, in particular the formation of spacers on the lateral sides of the gate of the transistors.

As illustrated in FIGS. 1A, 1C, the spacers are indeed typically formed by anisotropic etching of a dielectric layer 3 covering the gates 20 of the transistors. This etching makes it possible to etch basal portions 30b of the dielectric layer 3, which extend mainly parallel to the basic plane of the substrate 1, while preserving lateral portions 30l of the dielectric layer 3 which extend over the lateral sides 22 of the gate 20. The latter thus form the gate spacers E of the transistors.

The anisotropic etching must thus make it possible to remove the basal portions 30b by exposing the topSi 13, without damaging the topSi 13 and by preserving the lateral portions 30l.

Stopping etching at the interface 131 between the dielectric layer 3 and the topSi 13 is a major problem in the formation of spacers.

If the etching is prolonged for too long, the topSi can be partially consumed or damaged. On the contrary, if it is not sufficiently prolonged, the spacers can have etching bases which are damaging to the precise definition of the critical dimensions of the spacers.

To avoid a compromise which is difficult to find between these two conflicting conditions during the direct etching of the basal portions, document EP 3107125 B1 provides a prior step of modifying the basal portions 30b by implantation of light ions (FIG. 1B), followed by a step of removing the modified basal portions 31b, selectively at the non-modified lateral portions 30l (FIG. 1C). This makes it possible to relax the constraints on stopping etching. The etching precision is thus improved.

In practice, however, such a solution does not prove to be optimal. The etching precision remains improvable. The performances of the transistors can be further improved.

An aim of the present invention is to overcome the limitations of known solutions.

Another aim of the present invention is to propose a method for manufacturing spacers enabling a better definition of the critical dimensions of the spacers.

Other aims, characteristics and advantages of the present invention will appear upon examining the following description and the accompanying drawings. It is understood that other advantages can be incorporated.

SUMMARY

To achieve this aim, according to an embodiment, a method for forming spacers of a gate of a transistor located on an active layer made of a semiconductive material is provided. The method comprises:
  supplying a stack comprising the active layer and the gate, said gate having a top and lateral sides,
  forming a dielectric layer made of a dielectric base material covering the gate and at least partially the active layer on either side of the gate, said dielectric layer having lateral portions covering the lateral sides of the gate, and basal portions covering the top and the active layer, the basal portions having a thickness eb,
  anisotropically modifying basal portions of said dielectric layer by implantation of hydrogen-based ions in a direction Z parallel to the lateral sides of the gate, said implantation being done along the whole thickness eb of the basal portions, and at least partially in the active layer, said anisotropic modification forming first modified basal portions based on a first modified dielectric material and of non-modified lateral portions based on the dielectric base material, then
  an annealing, configured to desorb the hydrogen-based species in the active layer, said annealing transforming the first modified basal portions into second modified basal portions based on a second modified dielectric material, then
  removing the second modified basal portions by selective etching of the second modified dielectric material with respect to the dielectric base material and with respect to the semiconductive material, so as to form the spacers on the lateral sides of the gate from non-modified lateral portions.

Advantageously, the anisotropic modification of the basal portions is configured such that the hydrogen-based ions are implanted along the whole thickness eb of the basal portions, and at least partially in the active layer.

Advantageously, the method further comprises, after said anisotropic modification and before the removal of the modified basal portions, an annealing configured to desorb the hydrogen-based species implanted in the active layer. This annealing is further to configured to desorb at least 75%, even at least 90% and preferably at least 95%, of the hydrogen-based species implanted in the first modified basal portions.

In the scope of the development of the present invention, it has been observed that the precise stopping of the implantation of light ions at the interface between the dielectric layer and the active layer is difficult to perform, in practice. Thus, the method disclosed by prior art document EP 3107125 B1 has limited operating points. The ranges of parameters of this method according to the prior art are very restricted. This highly limits its practical implementation. It appears that the implantation of light ions is most often:
  either not sufficiently deep to sufficiently modify the basal portions over their whole height; it is thus difficult to remove the basal portions and the spacers thus obtained, typically have an etching base, or too deep and a part of the underlying active layer at the basal portions is also modified; this part of the modified active layer damages the performances of the transistors.

Contrary to known solutions of the prior art which aim to remove the implantation of ions in the active layer during the modification of the basal portions, the method according to the invention voluntarily provides an implantation of hydrogen-based ions until in the active layer, under the interface 131 between the dielectric layer and the active layer, as illustrated in FIG. 2. The whole thickness of the basal portions is thus modified. This avoids the formation of an etching base for the spacers, during the removal of the modified basal portions. The dimensional control of the spacers is improved.

It is therefore no longer necessary to specifically control the implantation depth of the hydrogen-based ions, as soon as this is greater than or equal to the thickness eb of the basal portions.

The constraints on the implantation depth are therefore advantageously relaxed in the method according to the invention. In particular, it is possible to expand the range of energy for implanting hydrogen-based ions, relative to the method of the prior art. This facilitates the implementation of the method.

The method further provides a recovery of the active layer by an annealing making it possible to desorb the hydrogen-based ions implanted under the interface between the dielectric layer and the active layer. The recovery can only consist of desorbing the hydrogen-based ions, or can additionally remove possible crystalline defects caused during the implantation.

This annealing transforms the first modified basal portions into second modified basal portions. The annealing conditions and/or the dielectric base material of the to dielectric layer are chosen so as to preserve a sufficient etching selectivity between the second modified dielectric material and the dielectric base material, so as to selectively remove the second modified basal portions with respect to the non-modified lateral portions.

The method according to the invention thus makes it possible to advantageously achieve baseless spacers and without damaging the underlying active layer.

BRIEF DESCRIPTION OF THE FIGURES

The aims, objectives, as well as the characteristics and advantages of the invention will emerge better from the detailed description of embodiments of the latter, which are illustrated by the following accompanying drawings, wherein.

Figure 1A:
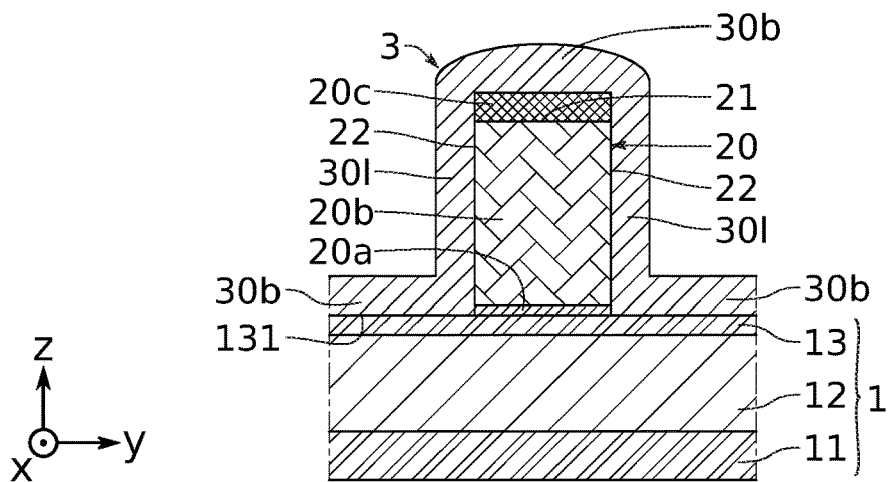
FIGS. 1A to 1C schematically illustrate the steps of a method for forming spacers according to the prior art.
Figure 1B:
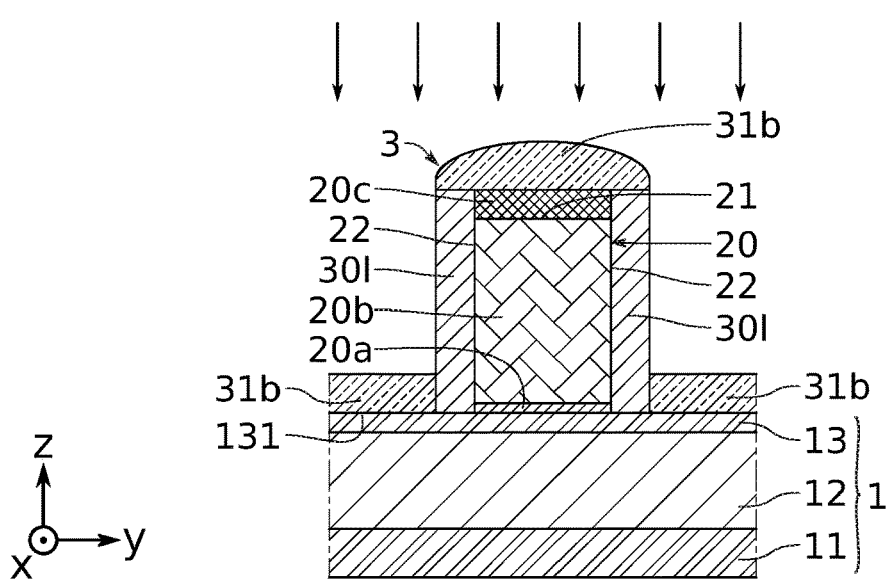
Figure 1C:
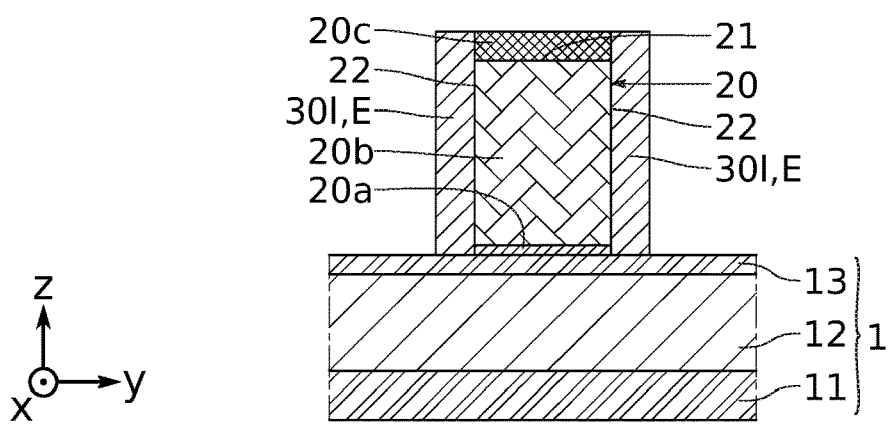

The drawings are given as examples and are not limiting of the invention. They constitute schematic principle representations intended to facilitate the understanding of the invention and are not necessarily to the scale of the practical applications. In particular, on the principle diagrams, the thicknesses of the different layers and portions, and the dimensions of the patterns are not representative of reality.

DETAILED DESCRIPTION

Before starting a detailed review of embodiments of the invention, below, optional characteristics are stated, which can possibly be used in association or alternatively:

According to an example, upon completion of the anisotropic modification by implantation, the semiconductive material of the active layer has a hydrogen concentration $[H]a1$, the annealing being performed such that upon completion of the annealing, the hydrogen concentration $[H]a2$ is zero or less than $0.05*[H]a1$, and preferably less than $0.02*[H]a1$.

According to an example, the dielectric base material is chosen such that the second modified dielectric material has an etching selectivity $S \geq 5:1$ with respect to the dielectric base material, and preferably $S \geq 10:1$.

According to an example, the second modified dielectric material has, after the desorption annealing, an etching selectivity $S \geq 5:1$ with respect to the non-modified dielectric base material.

According to an example, the dielectric base material of the dielectric layer is SiC-based.

According to an example, before the anisotropic modification by implantation of hydrogen-based ions, the dielectric base material of the dielectric layer is SiCO-based.

According to an example, upon completion of the anisotropic modification by implantation of hydrogen-based ions, the first modified dielectric material is $SiO_xH_y$-based, x and y being natural, non-zero integers.

According to an example, upon completion of the annealing, the second modified dielectric material is $SiO_x$-based, x being a natural, non-zero integer.

The pair of SiCO/SiOx materials advantageously has a good etching selectivity. The SiCO therefore constitutes a good dielectric base material for the implementation of the method according to the invention. This is not necessarily the only material which could be implemented in the method according to the invention.

According to another example, the dielectric base material of the dielectric layer is amorphous SiC- or SiCN-based. The method can thus further comprise a step of oxidising the first modified dielectric material, after the anisotropic modification of the basal portions, and preferably before the annealing.

According to an example, the semiconductive material is Si- or SiGe-based.

According to an example, the annealing is performed at a temperature greater than or equal to 150° C. This makes it possible to increase the hydrogen desorption speed. According to an example, the annealing is performed at a temperature greater than or equal to 600° C. This further makes it possible to repair the crystalline defects of the active layer, typically for a silicon semiconductive material.

According to an example, the annealing is performed for a duration t of between $1 \text{ min} \leq t \leq 10 \text{ min}$.

According to an example, the removal of the second modified basal portions is done by wet etching based on a solution comprising hydrofluoric (HF) acid. Wet etching by HF of SiOx is selective with respect to SiCO. On the contrary, an etching by HF plasma does not enable a removal of the second modified basal portions selectively at the non-modified lateral portions, for this pair of SiOx/SiCO materials.

According to an example, the formation of the dielectric layer is configured such that said dielectric layer is compliant and has a constant thickness equal to eb.

According to an example, the anisotropic modification by implantation is performed in an etching reactor.

According to an example, the anisotropic implantation is performed by inductive to coupling plasma from a hydrogenated species, preferably taken from among dihydrogen (H2), hydrogen bromide (HBr) and ammoniac (NH3).

According to an example, the plasma is formed by using at least one species X favouring the dissociation of the hydrogenated species to form said hydrogen-based ions, said at least one species X being taken from among argon, nitrogen, xenon, helium.

According to an example, the hydrogen-based ions are implanted with an implantation energy greater than 150 eV and/or less than 300 eV. This makes it possible to implant, sufficiently deeply, the hydrogen-based ions, in particular over the whole thickness eb of a SiCO-based dielectric layer from a few nanometres to a few tens of nanometres. The energy range of the hydrogen-based ions which can be utilised in the scope of the present invention is further a lot greater than that of the prior art. This makes it possible to facilitate the implementation of the method. The action of implementing a desorption annealing and/or post-implantation recovery makes it possible to relax the constraints on the implantation energy.

According to an example, the hydrogen-based ions are taken from among H+, H2+, H3+.

According to an example, the gate is a sacrificial gate pattern used in a so-called "gate last" method, where the sacrificial gate pattern is replaced by an operational gate after formation of spacers.

According to an example, the transistor is an FDSOI-type transistor. Preferably, the method comprises, after removal of the second modified basal portions on either side of the gate, a step of forming source and drain zones raised from the active layer made of a semiconductive material, for example, by epitaxy.

Advantageously, the semiconductive material is silicon. The semiconductive material can also be germanium (Ge) or silicon-germanium SiGe. The step of removing the second modified basal portions can be performed by wet etching selectively with Ge or SiGe and/or with SiGe oxide or Ge oxide.

According to an example, the annealing is configured such that the second modified dielectric material can be etched selectively with respect to the non-modified dielectric base material.

According to an example, the dielectric material is taken from among: SiCO, SiC, SiOCN, SiOCH.

Advantageously, the removal of the second modified basal portions is done by selective etching of the second modified dielectric material with respect to the dielectric base material, i.e. non-modified, and with respect to the semiconductive material.

According to an embodiment, the selective etching of the second modified dielectric material is a wet etching using a hydrofluoric (HF) acid-based solution.

Except if incompatible, it is understood that all of the optional characteristics above can be combined so as to form an embodiment which is not necessarily illustrated or described. Such an embodiment is clearly not excluded from the invention.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least another layer or at least one other element.

A layer can moreover be composed of several sublayers of one same material or of different materials.

In the present invention, the non-modified lateral portions can superficially comprise a low concentration of hydrogen-based ions, insofar as there is always, in practice, a low deflexion of ions with respect to the targeted implantation direction. This low concentration is not typically sufficient to "sufficiently" modify the dielectric material, i.e. such that it can then be etched. Furthermore, the superficial layers of lateral portions are generally of very low thickness, for example at least 10 times less than the thickness of the lateral portions, such that the lateral portions always comprise, strictly speaking, the non-modified dielectric material. In the present application, the non-modified lateral portions thus designate at least the lateral portions comprising the non-modified dielectric material, strictly speaking, and possibly this slightly modified superficial layer.

In the present patent application, the terms "concentration", "rate" and "content" are synonymous.

More specifically, a concentration can be expressed in relative units such as molar or mass fractions (% w).

Below, the concentrations are molar fractions expressed in unless otherwise specified.

Below, the pressure values are expressed in Torr or milliTorr, which is the unit usually used by a person skilled in the art. It is reminded that 1 Torr=133.322 Pa.

By "desorb" or "desorption", this means species of a material, a phenomenon of diffusing said species outside of the material in question. The term "desorb" can mean that the species are fully diffused outside of the material, or at least partially such that the to residual concentration of hydrogen species $[H]mr$ is less than at least 50% of the implanted hydrogen concentration $[H]m$, preferably less than at least 70% of $[H]m$, preferably less than at least 80% of $[H]m$, and preferably less than at least 90% of $[H]m$.

In the scope of the present invention, the annealing making it possible to desorb the hydrogen-based species is also called desorption annealing. This desorption annealing is in particular configured to desorb the hydrogen-based species implanted in the active layer and at least 75%, even at least 90% and preferably at least 95%, of the hydrogen-based species implanted in the first modified basal portions. Such a desorption annealing is therefore specifically configured to desorb the hydrogen-based species and cannot be assimilated to any annealing. In particular, a dry-annealing aiming to evaporate the water on the surface of a wafer, typically performed at a temperature of around 100° C., does not make it possible to desorb the hydrogen-based species as considered in the present invention. A dry-annealing is not assimilable to a desorption annealing such as considered in the present invention.

By a material A-"based" substrate, stack, layer, this means a substrate, a stack, a layer comprising this material A only or this material A and possibly other materials, for example alloy elements and/or doping elements. Thus, a silicon-based layer means, for example, an Si, n-doped Si, p-doped Si, SiGe layer. A germanium-based layer means, for example, a Ge, n-doped Ge, p-doped Ge, SiGe layer.

The word "dielectric" qualifies a material, the electrical conductivity of which is sufficiently low in the given application to be used as an insulator. In the present invention, a dielectric material preferably has a dielectric constant less than 7. The modified dielectric material is considered different from the non-modified material. In particular, the first modified dielectric material is different from the dielectric base material. The second modified dielectric material is different from the first modified dielectric material and from the dielectric base material.

Generally, but in a non-limiting manner, a spacer forms a ring around the gate, with a closed contour; therefore one single spacer around the gate could be referred to; however, the cross-sectional representations, and the favoured directions of the gates, make it that pairs of spacers are also referred to (or first and second spacers), terminology retained here.

Several embodiments of the invention implementing successive steps of the manufacturing method are described below. Unless explicitly specified, the adjective "successive" does not necessarily imply, even if this is generally preferred, that the steps follow one another immediately, intermediate steps could separate them.

Moreover, the term "step" means the performing of some of the method, and can mean a set of substeps.

Moreover, the term "step" does not compulsorily mean that the actions performed during a step are simultaneous or immediately successive. Certain actions of a first step can in particular be followed by actions linked to a different step, and other actions of the first step can then be resumed. Thus, the term "step" does not necessarily mean single and inseparable actions over time and in the phase sequence of the methods.

A preferably orthonormal marker, comprising the axes x, y, z is represented in the accompanying figures. When one single marker is represented on one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under", "underlying" refer to positions taken in the direction z.

The terms "vertical", "vertically" refer to a direction along z. The terms "horizontal", "horizontally" refer to a direction in the plane xy. The term "lateral" to a plane xz. Thus, the lateral sides of the gate extend parallel to a plane xz.

An element located "vertically aligned with" or "to the right of" another element means that these two elements are both located on one same line perpendicular to a plane wherein a lower or upper face of a substrate mainly extends, i.e. on one same line oriented vertically in the figures.

Figure 3A:
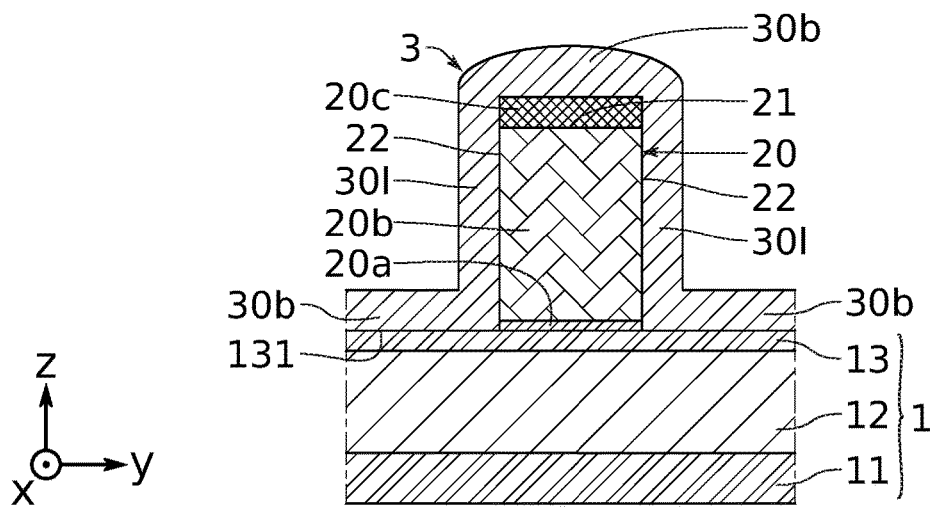
FIGS. 3A to 3D schematically illustrate the steps of a method for forming spacers according to an embodiment of the present invention.

FIGS. 3A to 3D illustrate an embodiment of the method according to the invention. According to this embodiment, an initial structure illustrated in FIG. 3A is provided.

This structure can typically comprise a substrate 1 comprising a silicon- or germanium-based semiconductive active layer 13. This active layer 13 typically has a thickness of around a few nanometres, for example 6 nm to 8 nm.

The substrate 1 can comprise a so-called "bulk" solid support 11, surmounted by an electrically insulating layer 12, typically a so-called "BOX" oxide layer.

The support 11, the insulating layer 12 and the active layer 13 can form a semiconductor on insulator-type substrate 1, for example a silicon on insulator (SOI) substrate or a germanium on insulator (GeOI) substrate, or also a fully depleted silicon on insulator (FDSOI) substrate.

The active layer 13 is surmounted by a gate pattern or gate 20.

Conventionally, this gate pattern 20 can successively have the following elements arranged from the active layer 13: an interface oxide layer 20a or a hafnium oxide layer to having a high dielectric constant, called high k, a polysilicon gate 20b and a hard mask 20c.

The gate pattern 20 typically has a height along Z, from several tens of nanometres to several hundreds of nanometres.

Below in the description, and to be concise, the gate pattern will be designated at gate 20 below.

As illustrated in FIG. 3A, a dielectric layer 3 made of a dielectric material, preferably made of SiCO, covers the gate 20 and the semiconductive active layer 13. The thickness eb of this dielectric layer 3 is preferably substantially constant. It can be of between 5 nm and 20 nm, preferably between 7 nm and 12 nm.

This dielectric layer 3 is, for example, formed by one of the following techniques: chemical vapour deposition (CVD), plasma enhanced chemical vapour deposition (PECVD), low pressure CVD (LPCVD), plasma enhanced atomic layer deposition (PEALD).

This dielectric layer 3 comprises a lateral portion 30*l* on each of the lateral sides 22 of the gate 20, basal portions 30*b* on the surface of the substrate 1 on either side of the gate 20, in contact with the active layer 13, and a basal portion 30*b* at the top 21 of the gate 20. The lateral portions 30*l* extend along planes perpendicular to the plane XY and the basal portions 30*b* extend along planes parallel to the plane XY.

The "basic" dielectric material considered for the formation of spacers in the scope of the present invention is preferably SiC- or SiCO-based, porous or non-porous. This material requires a specific etching strategy. In particular, conventional fluorocarbon etching methods, for example based on a chemistry CH3F/He/O2, modify the dielectric properties of such a material and cannot be considered for the formation of spacers.

Figure 3B:
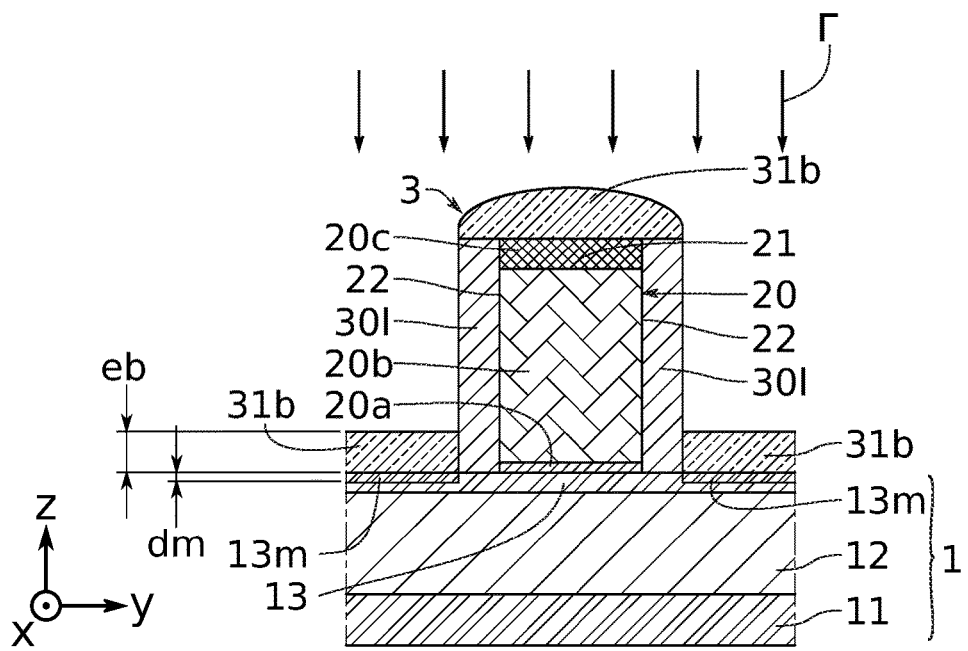
Figure 3C:
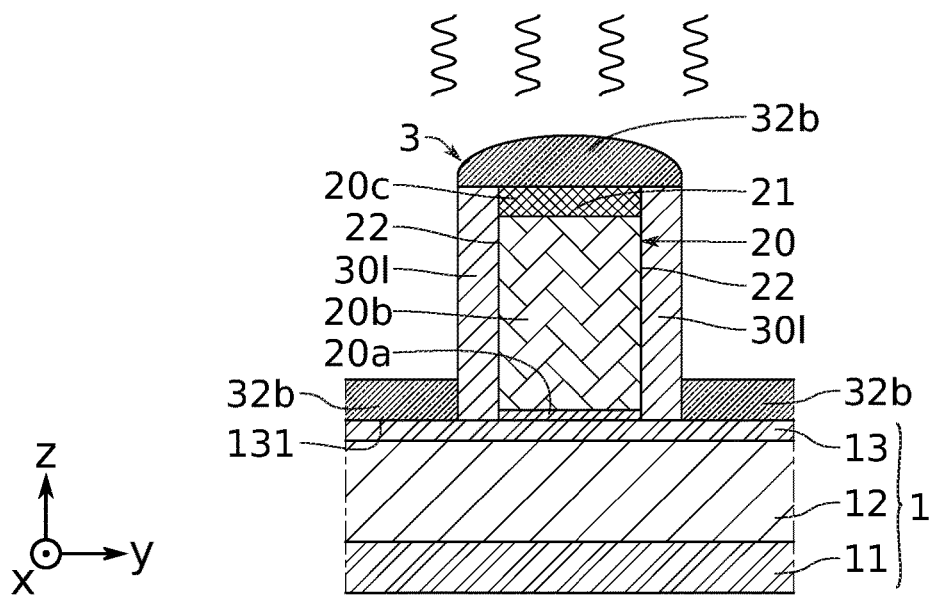
Figure 3D:
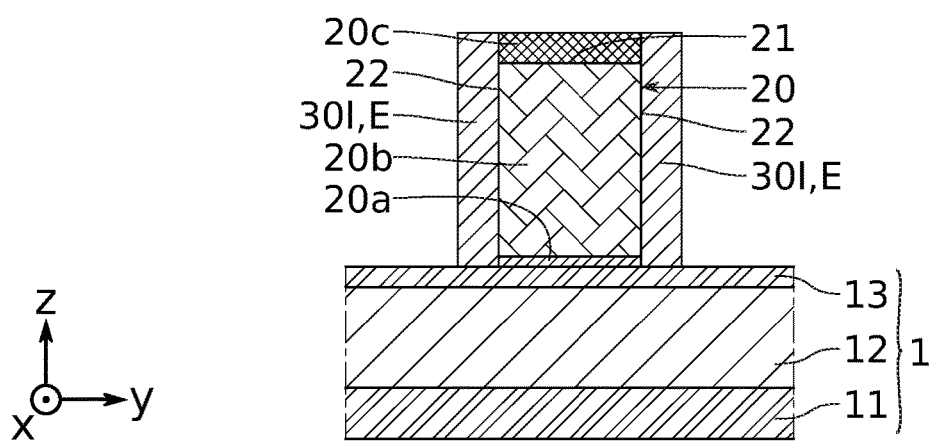

The etching strategy implemented in this method comprises a first modification of the dielectric material by implantation, as illustrated in FIG. 3B, an annealing leading to a second modification of the dielectric material, as illustrated in FIG. 3C, then a phase of etching this second modified dielectric material selectively to the non-modified dielectric material, as illustrated in FIG. 3D. Such a strategy is advantageously compatible with the use of SiC or SiCO.

In particular, SiCO is modified into SiOxHy during the implantation of hydrogen-based ions. SiOxHy is thus transformed into SiOx during the following annealing. SiOx has a good etching selectivity with respect to SiCO, typically during an HF-based wet etching. The phase of annealing SiOx can therefore be performed selectively to SiCO.

This is not the case, for example, for silicon nitride (SiN) which is conventionally to used as a dielectric material to form spacers. Modified SiN coming from the implantation of hydrogen-based ions indeed tends to return to its initial non-modified state, during annealing. The selective removal can thus no longer be performed. SiN is therefore not a material considered in the scope of the implementation of the method according to the present invention.

SiCO can be deposited directly on the gate 20 and the active layer 13, for example by CVD. A SiCO formed in situ, from a deposition of SiC, followed by an oxidation, for example by O2-based plasma or by decompression, is not a solution retained in the scope of the present invention. SiCO is here a deposited material and not a SiC modified by an O2 plasma.

The anisotropic modification, annealing and selective removal steps are detailed below, respectively regarding FIGS. 3B, 3C, 3D.

As illustrated in FIG. 3B, the anisotropic modification of the basal portions 30b is performed by implantation of hydrogen-based ions. The implantation energy r is chosen so as to modify the basal portions 30b over the whole of their thickness eb. First modified basal portions 31b of thickness eb are thus obtained. In the scope of the invention, the implantation is preferably performed within an etching reactor.

However, this anisotropic modification does not modify the lateral portions 30l located on the sides 22 of the gate 20, these lateral portions 30l being masked by the basal portion 30B located at the top 21 of the gate 20.

Preferably, an implantation energy greater than or equal to 150 eV will be chosen, for example of around 200 eV to 300 eV. This makes it possible to obtain an implantation, very directional along Z. The spatial implantation resolution between the implanted basal portions 30b and the non-implanted lateral portions 30l is improved. Controlling the critical dimensions of the spacers is thus improved.

Moreover, such an implantation energy makes it possible to modify the basal portions 30b over the whole of their thickness eb. A part 13m of the underlying active layer 13 is also implanted by hydrogen-based ions.

Figure 2:
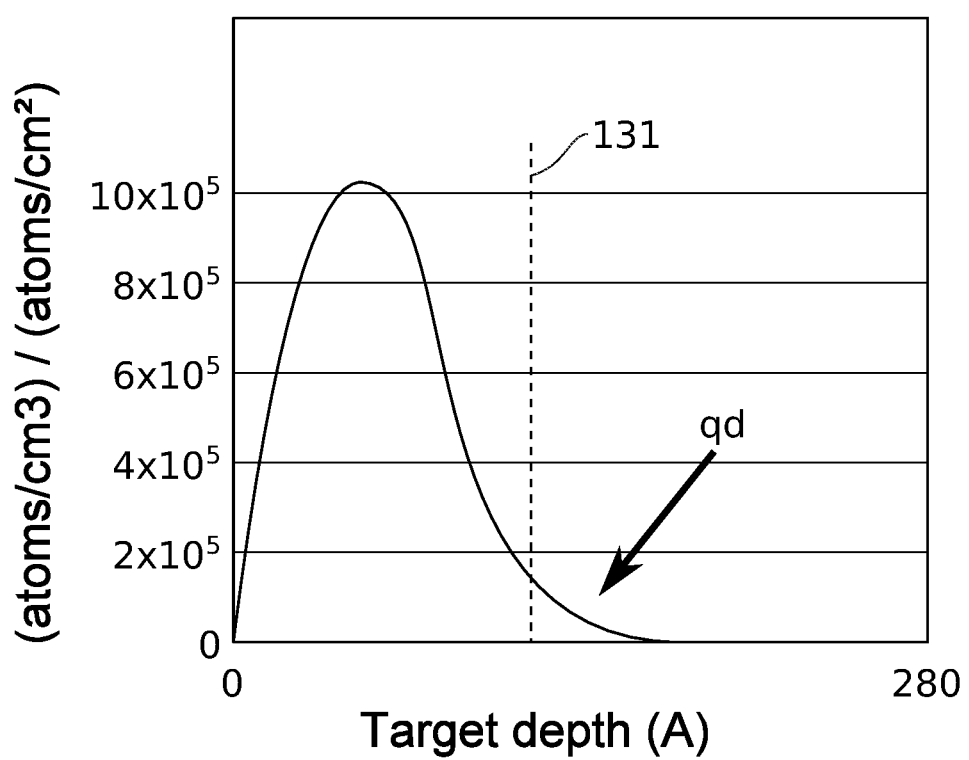
FIG. 2 illustrates the distribution of light ions according to an implantation profile of the prior art.

FIG. 2 illustrates an implantation profile obtained by SRIM (stopping and range of ions in matter)-type simulation, for an implantation energy of 300 eV. This implantation profile has a distribution line qd which extends beyond the interface 131 between the first modified basal portions of the dielectric layer and the active layer 13. This distribution line corresponds to the part 13m of the modified semiconductive material. It can extend over a depth dm greater than or equal to 3 nm and preferably greater than or equal to 5 nm, even greater than or equal to 10 nm. It can extend over a depth dm of a few nanometres, for to example 3 nm to 5 nm, according to the implantation conditions and materials implemented.

The implantation conditions can be determined by simulation using an SRIM (stopping and range of ions in matter)- or TRIM (transport of ions in matter)-type simulation.

Another parameter impacting on the total dose of implanted hydrogen-based ions is the duration t during which the implantation energy r is maintained during the anisotropic modification phase.

This duration t can vary by from a few seconds to a few hundred seconds, according to the targeted implantation depth and the materials used.

The duration t of the anisotropic modification can be around 60 s to modify a SiCO thickness of 10 nm.

The implantation of hydrogen-based ions can be performed in an implanter or, preferably, from a plasma.

In the latter case, a capacitive coupled plasma (CCP) reactor or an inductively coupled plasma (ICP) reactor, or a plasma by immersion.

According to an embodiment, the plasma used is formed from a gas comprising at least one first non-carbonated hydrogenated gaseous component referenced H, the dissociation of which generates said hydrogen-based ions and optionally only, a second gaseous component X comprising at least one species favouring the dissociation of the first component H to form said hydrogen-based ions.

The first component H is preferably chosen from among dihydrogen (H2), silane (SiH4), ammoniac (NH3) or hydrogen bromide (HBr). The second component X is preferably chosen from among helium (He), dinitrogen (N2), argon (Ar) or xenon (Xe).

Preferably, the flow rate of the first component H is of between 10 and 500 sccm (cubic centimetres per minute). The flow rate of the second component X is preferably of between 10 and 500 sccm.

The addition of a second component acting as a dissociating gas (such as argon, helium, xenon, nitrogen), can in particular facilitate the dissociation of the first component and thus favour the implantation of said first dissociated component in the dielectric layer. It results from this, that the implanted dose is higher. The second component must however be added is small proportions, to avoid a risk of spraying of the dielectric layer by ions coming from said second component. Thus, a gas ratio will be chosen between the first component and the second component of between 1:19 and 19:1, even between 1:9 and 9:1, even between 1:5 and 5:1.

The implantation by plasma is configured so as to modify the dielectric layer 3 without nevertheless spraying it.

The following additional parameters can be adjusted for the phase of anisotropic modification by implantation by plasma:

the pressure inside the chamber of the plasma reactor. Preferably, this pressure is of between 5 milliTorr and 100 milliTorr (that is between 0.666 Pa. and 13.332 Pa), typically of around 10 milliTorr (1.333 Pa). This makes it possible to avoid an isotropic implantation;

the temperature is preferably less than 100° C., in order to effectively modify the dielectric layer 3;

the polarisation voltage (bias) of the plasma varies typically between 20V and 300V;

the power of the plasma source can be adjusted so as to obtain a more or less significant ion flow. Typically, a source power of between 0 W and 2000 W will be chosen; and the plasma source or, preferably, the bias can be pulsed, with a frequency of between 100 Hz and 5 kHz. Typically, a cyclic ratio of 10% to 90% will be chosen to reduce the ion energy.

These parameters can be adjusted according to the nature of the basal portions to be etched and to the thickness eb.

According to an embodiment, the anisotropic modification to modify 10 nm of SiCO is performed with the following parameters: Pressure=10 mTorr/Polarisation RF voltage=250V/duration t=60 s/He flow rate=250 sccm/CH4 flow rate=10 sccm/RF power=250 W.

As illustrated in FIG. 3C, the anisotropic modification of the basal portions is followed by an annealing. This annealing is configured to remove the hydrogen implanted in the parts 13m of the active layer 13, by desorption. This annealing can also recover or repair these portions 13m so as to obtain an undamaged active layer 13.

The annealing further has the effect of transforming the first modified basal portions 31b into second modified basal portions 32b.

This annealing is done typically at a temperature greater than or equal to 150° C. to desorb the hydrogen implanted in the parts 13m of the active layer 13. It can possibly be performed at a higher temperature, for example at a temperature of around 600° C., to repair the crystalline defects of the semiconductive material, which would have been able to be caused during the implantation.

The annealing can be done according to an RTA (Rapid Thermal Annealing)-type known rapid method. Other annealing methods can however be considered. A temperature ramp and/or a temperature peak can be applied for the duration of the annealing. The duration of the annealing is typically of between a few tens of seconds and a few minutes, for example 5 min.

Upon completion of the annealing, the active layer 13 has substantially recovered over the whole of its thickness, the portions 13m modified by implantation have disappeared, and the first modified basal portions 31b become second modified basal portions 32b, as illustrated in FIG. 3C.

The selective removal of the second modified basal portions can be done by etching according to several embodiment variants. Dry or wet etching chemistries can be used.

According to an embodiment, the removal of the second modified basal portions 32b is done by selective wet etching to the semiconductive material of the active layer 13. If the semiconductive material is silicon, then the removal of the modified portions 32b is done by wet etching selectively with silicon (Si).

Preferably, the selective etching with silicon is obtained using a hydrofluoric (HF) acid-based solution. For example, for remove 10 nm of SiOx, a 1% HF solution for 40 s can be used.

As an example for a dielectric layer 3 made of SiCO, with a hydrofluoric (HF) acid-based solution, 1% diluted, the etching speed of SiOx (modified dielectric material) is of around 6 nm/min, while the etching speed of SiCO (non-modified dielectric material) is almost zero.

This makes it possible to fully remove the modified portions 32b without consuming the non-modified lateral portions 30l on the sides 22 of the gate 20, nor consuming the active layer 13.

The performances of the transistors are thus preserved.

According to another embodiment, the removal of the second modified basal portions is done by selective dry etching with the semiconductive material. A CHxFy-type fluorocarbon or hydrofluorocarbon polymerising etching chemistry, with x and y whole, can for example be implemented during this dry etching.

After removal of the second modified basal portions 32b, the spacers E are typically formed by the non-modified lateral portions 30l (FIG. 3D). The method advantageously makes it possible to produce spacers E for MOSFET transistors.

The invention is not, however, limited to the embodiments described above.

The invention claimed is:

1. A method for forming at least one spacer of a gate of a transistor located on an active layer made of a semiconductive material, comprising:
providing a stack comprising the active layer and the gate having a top and lateral sides;
forming a dielectric layer made of a dielectric base material covering the gate and at least partially the active layer on either side of the gate, the dielectric layer having lateral portions covering the lateral sides of the gate, and basal portions covering the top and the active layer, the basal portions having a thickness;
anisotropically modifying the basal portions of the dielectric layer by implanting hydrogen-based ions in a direction parallel to the lateral sides of the gate, the implanting being performed along the whole thickness of the basal portions, and at least partially in the active layer, the anisotropically modifying forming first modified basal portions based on a first modified dielectric material and non-modified lateral portions based on the dielectric base material; then
performing an annealing configured to desorb the hydrogen-based ions implanted in the active layer and at least 75% of the hydrogen-based ions implanted in the first modified basal portions, the annealing transforming the first modified basal portions into modified basal portions based on a second modified dielectric material; and then
removing the second modified basal portions by selective etching of the second modified dielectric material with respect to the dielectric base material and with respect to the semiconductive material, so as to form the at least one spacer on the lateral sides of the gate from non-modified lateral portions.

2. The method according to claim 1, wherein the dielectric base material is chosen from among SiC-based and SiCO-based materials such that the second modified dielectric material has an etching selectivity (S) of S≥5:1 with respect to the dielectric base material.

3. The method according to claim 1, wherein the dielectric base material is chosen from among SiC-based and SiCO-based materials such that the second modified dielectric material has an etching selectivity (S) of S≥10:1 with respect to the dielectric base material.

4. The method according to claim 1, wherein the dielectric base material is SiC-based.

5. The method according to claim 1, wherein, before the anisotropic modification by implanting the hydrogen-based ions, the dielectric base material is SiCO-based and, upon completion of the anisotropic modification, the first modified dielectric material is SiOxHy-based, and, upon completion of the annealing, the second modified dielectric material is SiOx-based, x and y being natural, non-zero integers.

6. The method according to claim 1, wherein the annealing is performed at a temperature greater than or equal to 150° C. or at a temperature greater than or equal to 600° C.

7. The method according to claim 1, wherein the annealing is performed for a duration (t), where 1 min≤t≤10 min.

8. The method according to claim 1, wherein the removing of the second modified basal portions is performed by wet etching based on a solution comprising hydrofluoric (HF) acid.

9. The method according to claim 1, wherein the anisotropic modification is performed by inductive coupled plasma from a hydrogenated species.

10. The method according to claim 9, wherein the hydrogenated species are chosen from among dihydrogen (H2), hydrogen bromide (HBr), and ammonia (NH3).

11. The method according to claim 9, wherein the inductive coupled plasma is formed by using at least one species (X) favoring dissociation of the hydrogenated species to form the hydrogen-based ions, the at least one species (X) being chosen from among argon, nitrogen, xenon, and helium.

12. The method according to claim 1, wherein the hydrogen-based ions are implanted with an implantation energy greater than 150 eV and/or less than 300 eV.

13. The method according to claim 1, wherein upon completion of the anisotropic modification, the semiconductive material of the active layer has a hydrogen concentration ([H]a1), the annealing being performed such that upon completion of the annealing, a hydrogen concentration ([H]a2) is zero or less than 0.05*[H]a1, and preferably less than 0.02*[H]a1.

14. The method according to claim 1, wherein upon completion of the anisotropic modification, the semiconductive material of the active layer has a hydrogen concentration ([H]a1), the annealing being performed such that upon completion of the annealing, a hydrogen concentration ([H]a2) is zero or less than 0.02*[H]a1.

15. The method according to claim 1, wherein the anisotropic modification is performed in an etching reactor.

16. The method according to claim 1, wherein the annealing is configured to desorb at least 90% of the hydrogen-based ions implanted in the first modified basal portions.

17. The method according to claim 1, wherein the annealing is configured to desorb at least 95% of the hydrogen-based ions implanted in the first modified basal portions.

* * * * *